United States Patent
Shaffer et al.

(10) Patent No.: US 8,756,449 B2
(45) Date of Patent: Jun. 17, 2014

(54) PHASE-BASED OPERATION OF DEVICES ON A POLYPHASE ELECTRIC DISTRIBUTION SYSTEM

(75) Inventors: Shmuel Shaffer, Palo Alto, CA (US); Jean-Philippe Vasseur, Saint Martin d'Uriage (FR); Sandeep Jay Shetty, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 384 days.

(21) Appl. No.: 13/043,213

(22) Filed: Mar. 8, 2011

(65) Prior Publication Data

US 2012/0233485 A1    Sep. 13, 2012

(51) Int. Cl.
*G06F 1/26* (2006.01)
(52) U.S. Cl.
USPC .......................................... 713/340; 713/300
(58) Field of Classification Search
None
See application file for complete search history.

(56) References Cited

U.S. PATENT DOCUMENTS

| | | | | |
|---|---|---|---|---|
| 5,521,491 | A * | 5/1996 | Najam | 324/86 |
| 5,617,329 | A * | 4/1997 | Allison et al. | 700/286 |
| 6,247,072 | B1 | 6/2001 | Firestone | |
| 6,377,642 | B1 | 4/2002 | Dollard | |
| 7,366,297 | B1 | 4/2008 | Marshall et al. | |
| 7,512,336 | B1 | 3/2009 | Meli et al. | |
| 7,975,291 | B2 * | 7/2011 | Amamiya et al. | 726/6 |
| 2008/0114581 | A1 * | 5/2008 | Meir et al. | 703/13 |
| 2010/0134089 | A1 | 6/2010 | Uram et al. | |
| 2010/0262393 | A1 | 10/2010 | Sharma et al. | |

FOREIGN PATENT DOCUMENTS

EP    0178804 A3    10/1987

OTHER PUBLICATIONS

Thubert, et al., "RPL Objective Function Zero", draft-ietf-roll-of0-05, IEFT Internet-Draft, Jan. 2011, 10 pages.
Vasseur, et al., "Routing Metrics Used for Path Calculation in Low Power and Lossy Networks", draft-ietf-roll-routing-metrics-18, IEFT Internet-Draft, Feb. 2011, 31 pages.
Winter, et al., "RPL: IPv6 Routing Protocol for Low Power and Lossy Networks", draft-ietf-roll-rpl-18, IEFT Internet-Draft; Feb. 2011, 160 pages.
Gaur, et al., "Notification of Transmittal of the International Search Report and the Written Opinion of the International Searching Authority, or the Declaration", Patent Cooperation Treaty, Oct. 5, 2012, 14 pages, PCT/US2012/027994, European Patent Office, Rijswijk, Netherlands.

(Continued)

*Primary Examiner* — Paul Yanchus, III
(74) *Attorney, Agent, or Firm* — Edwards Wildman Palmer LLP; James M. Behmke; Stephen D. LeBarron

(57) ABSTRACT

In one embodiment, a device in a computer network monitors an alternating-current (AC) waveform of an electrical power source at the device, where the power source is part of a polyphase power source system. Once the device determines a particular phase of the polyphase power source system at the device, then the device joins a directed acyclic graph (DAG) specific to the particular phase. In another embodiment, a device detects a time of a zero crossing of the AC waveform, and may then determine a particular phase of the polyphase power source system at the device based on the time of the zero crossing relative to a corresponding location within a frequency hopping superframe of the computer network.

12 Claims, 13 Drawing Sheets

(56) References Cited

OTHER PUBLICATIONS

Mak, S. T., "A Synergistic Approach to Implement Demand Response, Asset Management and Service Reliability Using Smart Metering, AMI and MDM Systems", Power & Energy Society General Meeting, Jul. 2009; pp. 1-3; PES '09, IEEE, Piscataway, New Jersey.

* cited by examiner

US 8,756,449 B2

PHASE-BASED OPERATION OF DEVICES ON A POLYPHASE ELECTRIC DISTRIBUTION SYSTEM

TECHNICAL FIELD

The present disclosure relates generally to computer networks, and, more particularly, to phase-based operation of devices and directed acyclic graph (DAG) establishment in electric transmission grids.

BACKGROUND

Electric power is generally transmitted from generation plants to end users (industries, corporations, homeowners, etc.) via a transmission and distribution grid consisting of a network of power stations, transmission circuits, and substations interconnected by powerlines. Once at the end users, electricity can be used to power any number of devices. The transfer of alternating-current (AC) electric power to the end users most frequently takes the form of three-phase electric power, where three current waveforms are produced that are generally equal in magnitude and 120° out of phase to each other. If the load on a three-phase system is balanced equally among the phases, no current flows through a neutral point, which is an important design aspect of the electric grid, allowing for efficient use of transformer capacity, reduced materials (e.g., size of a neutral conductor), etc. However, there are many factors that may create imbalance between the phases, such as excess load usage, downed powerlines, etc.

The topology of the electric transmission grid typically considers the balancing of the three-phase system, such that each end user (and thus the end user's devices) is attached to the grid via a particular phase's current waveform (though certain customers may be connected to two or three phases of the grid). Most often, however, the end users, and more specifically the end users' devices, are unaware of which phase they are operating upon. Accordingly, there is no phase-based control of the devices beyond planning the physical topology of the grid, which is difficult (and often expensive) to change once it is installed.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

Figure 1:
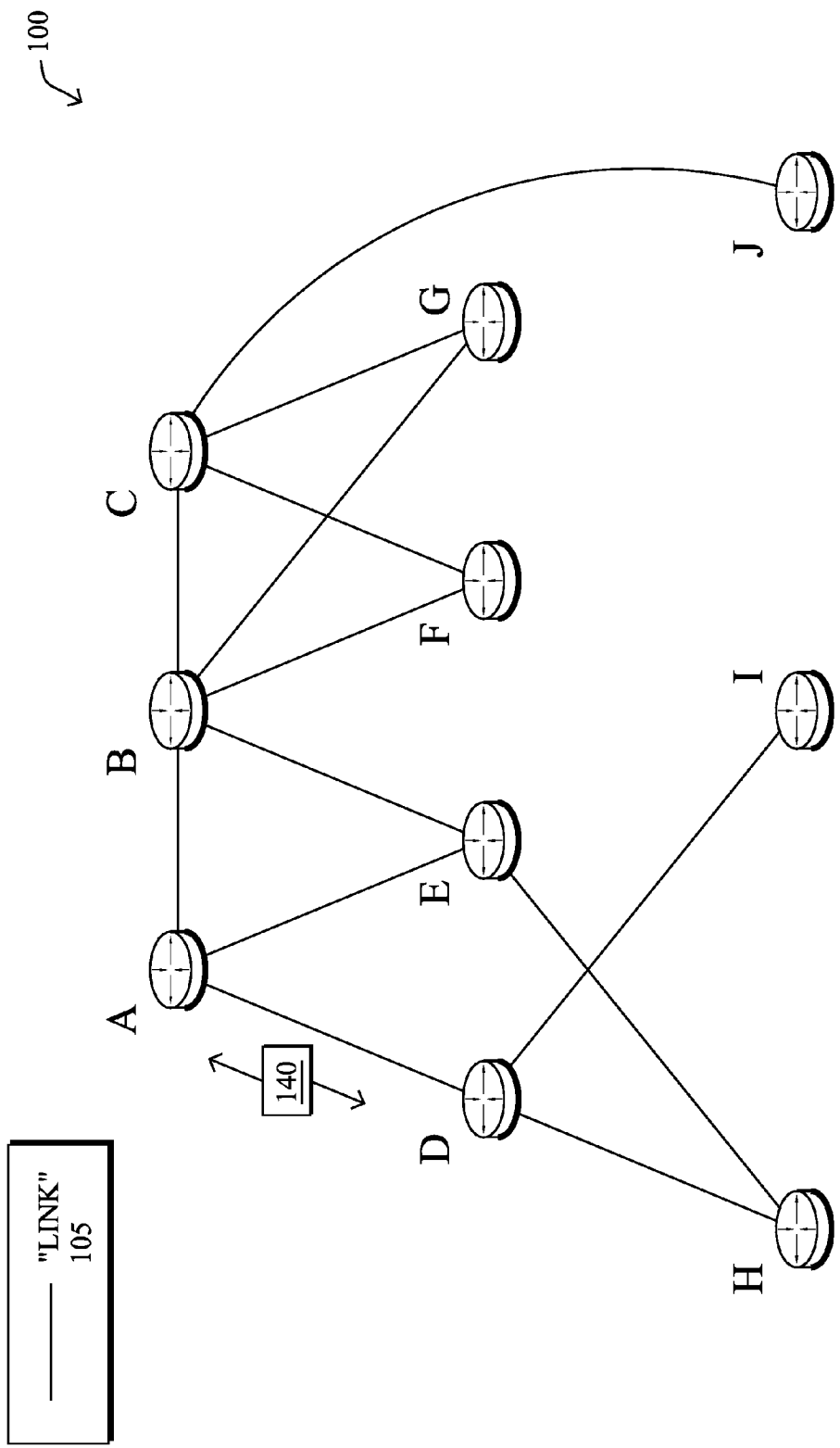
FIG. 1 illustrates an example computer network.

According to one or more embodiments of the disclosure, a device in a computer network monitors an alternating-current (AC) waveform of an electrical power source at the device, where the power source is part of a polyphase power source system. Once the device determines a particular phase (or phases) of the polyphase power source system at the device based on the AC waveform, then the device joins a directed acyclic graph (DAG) specific to the particular phase.

According to one or more additional embodiments of the disclosure, a device in a frequency hopping computer network monitors an AC waveform of an electrical power source at the device, where the power source is part of a polyphase power source system. The device detects a time of a zero crossing of the AC waveform, and may then determine a particular phase of the polyphase power source system at the device based on the time of the zero crossing relative to a corresponding location within a frequency hopping superframe of the computer network.

Description

A computer network is a geographically distributed collection of nodes interconnected by communication links and segments for transporting data between end nodes, such as personal computers and workstations, or other devices, such as sensors, utility meters, etc. Many types of networks are available, with the types ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC) such as IEEE 61334, IEEE P1901.2, and others. In addition, a Mobile Ad-Hoc Network (MANET) is a kind of wireless ad-hoc network, which is generally considered a self-configuring network of mobile routes (and associated hosts) connected by wireless links, the union of which forms an arbitrary topology.

Smart object networks, in particular, are a specific type of network having spatially distributed autonomous devices such as sensors, actuators, etc. For example, sensor networks may cooperatively monitor physical or environmental conditions at different locations, such as, e.g., energy/power consumption, resource consumption, etc. Another type of smart object includes actuators, e.g., responsible for turning on/off an engine or perform any other actions. Generally, smart object networks may include any type of device that is able to communicate information on a computer network, such as household appliances (air conditioners, refrigerators, lights, etc.), industrial devices (heating, ventilating, and air conditioning (HVAC), pumps, motors, etc.), and other "smart" devices.

That is, smart object networks are typically interconnected by a computer network, such as wireless networks, though wired connections are also available. For instance, each smart device (node) in a smart object network may generally be equipped with a radio transceiver or other communication port, a microcontroller, and an energy source, such as a battery (or, in particular to the embodiments herein, a transmission grid power source). Typically, size and cost constraints on sensor nodes result in corresponding constraints on resources such as energy, memory, computational power and bandwidth. Correspondingly, a reactive routing protocol may, though need not, be used in place of a proactive routing protocol for sensor networks.

FIG. 1 is a schematic block diagram of an example computer network 100 illustratively comprising "smart" nodes/devices 200 (e.g., labeled as shown, "A" through "J," and described in FIG. 2 below) interconnected by various methods of communication, such as links 105. For instance, the links between the nodes may be wired links or may comprise a wireless communication medium, where certain nodes 200 may be in communication with other nodes 200, e.g., based on distance, signal strength, current operational status, location, etc. Those skilled in the art will understand that any number of nodes, devices, links, etc. may be used in the computer network, and that the view shown herein is for simplicity.

Note that one example communication link 105 is powerline communication links, which often exhibit, in many ways, similar properties as wireless (radio frequency or "RF") links, such as in terms of lossiness, collisions, etc. Also, as will be understood by those skilled in the art, powerline communication systems are multi-hop systems, where even though the underlying transmission medium (the powerline) interconnects all of the nodes (e.g., like a broadcast domain), nodes in a PLC network communicate with each other over the transmission medium through other nodes relaying/routing messages.

Data packets 140 (e.g., traffic and/or messages) may be exchanged among the nodes/devices of the computer network 100 using predefined network communication protocols such as the Transmission Control Protocol/Internet Protocol (TCP/IP), User Datagram Protocol (UDP), Multi-Protocol Label Switching (MPLS), various proprietary protocols, etc. In this context, a protocol consists of a set of rules defining how the nodes interact with each other. In addition, packets within the network 100 may be transmitted in a different manner depending upon device capabilities, such as source routed packets.

Figure 2:
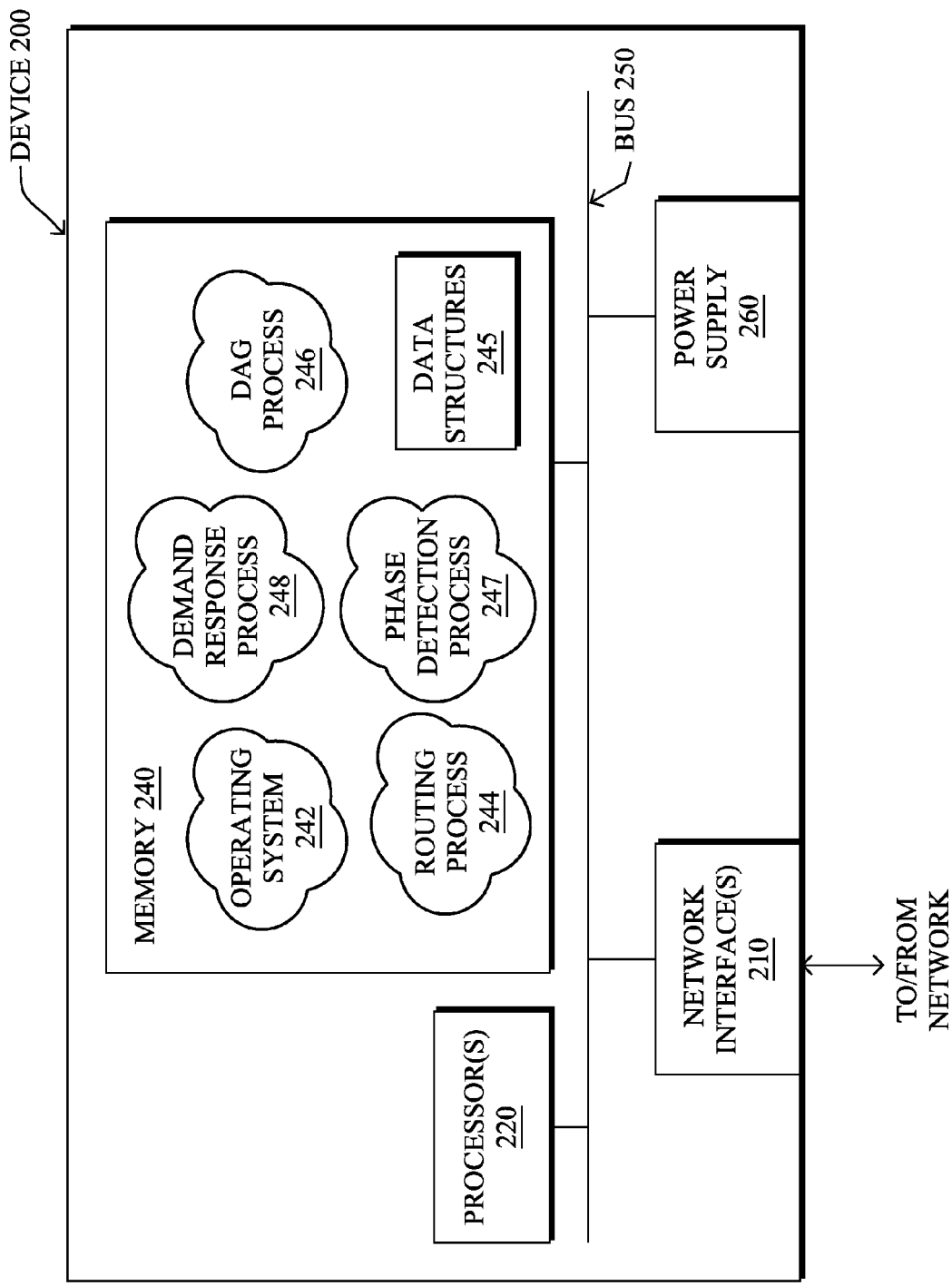
FIG. 2 illustrates an example network device/node.

FIG. 2 is a schematic block diagram of an example node/device 200 that may be used with one or more embodiments described herein, e.g., as a smart device in the network 100. The device may comprise a network interface 210, a processor 220 (e.g., an 8-64 bit microcontroller), and a memory 240 interconnected by a system bus 250. Notably, the device may also be powered by a power supply 260, such as a battery, or, more specifically with regard to one or more embodiments herein, a "plug-in" power supply.

The network interface 210 contains the mechanical, electrical, and signaling circuitry for communicating data over physical and/or wireless links coupled to the network 100. The network interface may be configured to transmit and/or receive data using a variety of different communication protocols, including, inter alia, TCP/IP, UDP, wireless protocols (e.g., IEEE Std. 802.15.4, WiFi, Bluetooth®,), Ethernet, powerline communication (PLC) protocols, broadband over power lines (BPL), etc. Note that certain devices may have two different types of network connections 210. For instance, devices may have one or more interfaces used to communicate with other devices within the computer network (e.g., a mesh cell), and for certain other devices ("root" devices), another interface may be used as a WAN uplink network interface between the root node and, for example, a head-end device located through the WAN.

The memory 240 comprises a plurality of storage locations that are addressable by the processor 220 for storing software programs and data structures associated with the embodiments described herein. Notably, certain devices may have limited memory or no memory (e.g., no memory for storage other than for programs/processes operating on the device). The processor 220 may comprise necessary elements or logic adapted to execute the software programs and manipulate the data structures 245. An operating system 242, portions of which are typically resident in memory 240 and executed by the processor, to functionally organizes the device by, inter alia, invoking operations in support of software processes and/or services executing on the device. These software processes and/or services may comprise routing process/services 244, which may include an illustrative directed acyclic graph (DAG) process 246. Also, an illustrative phase detection process 247 may also be present in memory 240, for use as described herein, as well as a demand response (DR) process 248.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process).

Routing process (services) 244 contains computer executable instructions executed by the processor 220 to perform functions provided by one or more routing protocols, such as proactive or reactive routing protocols as will be understood by those skilled in the art. These functions may, on capable devices, be configured to manage a routing/forwarding table containing, e.g., data used to make routing/forwarding decisions. In particular, in proactive routing, connectivity is discovered and known prior to computing routes to any destination in the network, e.g., link state routing such as Open Shortest Path First (OSPF), or Intermediate-System-to-Intermediate-System (ISIS), or Optimized Link State Routing (OLSR). Reactive routing, on the other hand, discovers neighbors (i.e., does not have an a priori knowledge of network topology), and in response to a needed route to a destination, sends a route request into the network to determine which neighboring node may be used to reach the desired destination. Example reactive routing protocols may comprise Ad-hoc On-demand Distance Vector (AODV), Dynamic Source Routing (DSR), DYnamic MANET On-demand Routing (DYMO), etc. Notably, on devices not capable or configured to store routing entries, routing process 244 may consist solely of providing mechanisms necessary for source routing techniques. That is, for source routing, other devices in the network can tell the less capable devices exactly where to send the packets, and the less capable devices simply forward the packets as directed.

Low power and Lossy Networks (LLNs), e.g., certain smart object networks, may be used in a myriad of applications such as for "Smart Grid" and "Smart Cities." A number of challenges in LLNs have been presented, such as:

1) Links are generally lossy, such that a Packet Delivery Rate/Ratio (PDR) can dramatically vary due to various sources of interferences, e.g., considerably affecting the bit error rate (BER);

2) Links are generally low bandwidth, such that control plane traffic must generally be bounded and negligible compared to the low rate data traffic;

3) There are a number of use cases that require specifying a set of link and node metrics, some of them being dynamic, thus requiring specific smoothing functions to avoid routing instability, considerably draining bandwidth and energy;

4) Constraint-routing may be required by some applications, e.g., to establish routing paths that will avoid non-encrypted links, nodes running low on energy, etc.;

5) Scale of the networks may become very large, e.g., on the order of several thousands to millions of nodes; and 6) Nodes may be constrained with a low memory, a reduced processing capability, a low power supply (e.g., battery).

In other words, LLNs are a class of network in which both the routers and their interconnects are constrained: LLN routers typically operate with constraints, e.g., processing power, memory, and/or energy (battery), and their interconnects are characterized by, illustratively, high loss rates, low data rates, and/or instability. LLNs are comprised of anything from a few dozen and up to thousands or even millions of LLN routers, and support point-to-point traffic (between devices inside the LLN), point-to-multipoint traffic (from a central control point to a subset of devices inside the LLN) and multipoint-to-point traffic (from devices inside the LLN towards a central control point).

An example protocol specified in an Internet Engineering Task Force (IETF) Internet Draft, entitled "RPL: IPv6 Routing Protocol for Low Power and Lossy Networks"<draft-ietf-roll-rpl-18> by Winter, at al. (Feb. 4, 2011 version), provides a mechanism that supports multipoint-to-point (MP2P) traffic from devices inside the LLN towards a central control point (e.g., LLN Border Routers (LBRs) or "root nodes/devices" generally), as well as point-to-multipoint (P2MP) traffic from the central control point to the devices inside the LLN (and also point-to-point, or "P2P" traffic). RPL (pronounced "ripple") may generally be described as a distance vector routing protocol that builds a Directed Acyclic Graph (DAG) for use in routing traffic/packets 140, in addition to defining a set of features to bound the control traffic, support repair, etc. Notably, as may be appreciated by those skilled in the art, RPL also supports the concept of Multi-Topology-Routing (MTR), whereby multiple DAGs can be built to carry traffic according to individual requirements.

Note that while LLNs and RPL are described herein, the techniques described herein may be utilized with any type of computer network (smart object network) and any suitable type of DAG creation protocol.

A DAG is a directed graph having the property that all edges are oriented in such a way that no cycles (loops) are supposed to exist. All edges are contained in paths oriented toward and terminating at one or more root nodes (e.g., "clusterheads or "sinks"), often to interconnect the devices of the DAG with a larger infrastructure, such as the Internet, a wide area network, or other domain. In addition, a Destination Oriented DAG (DODAG) is a DAG rooted at a single destination, i.e., at a single DAG root with no outgoing edges. A "parent" of a particular node within a DAG is an immediate successor of the particular node on a path towards the DAG root. Note also that a tree is a kind of DAG, where each device/node in the DAG generally has one parent or one preferred parent. DAGs may generally be built based on an Objective Function (OF). The role of the Objective Function is generally to specify rules on how to build the DAG (e.g. number of parents, backup parents, etc.).

In addition, one or more metrics/constraints may be advertised by the routing protocol to optimize the DAG against. Also, the routing protocol allows for including an optional set of constraints to compute a constrained path, such as if a link or a node does not satisfy a required constraint, it is "pruned" from the candidate list when computing the best path. (Alternatively, the constraints and metrics may be separated from the OF.) Additionally, the routing protocol may include a "goal" that defines a host or set of hosts, such as a host serving as a data collection point, or a gateway providing connectivity to an external infrastructure, where a DAG's primary objective is to have the devices within the DAG be able to reach the goal. In the case where a node is unable to comply with an objective function or does not understand or support the advertised metric, it may be configured to join a DAG as a leaf node. As used herein, the various metrics, constraints, policies, etc., are considered "DAG parameters."

Illustratively, example metrics used to select paths (e.g., preferred parents) may comprise cost, delay, latency, bandwidth, estimated transmission count (ETX), etc., while example constraints that may be placed on the route selection may comprise various reliability thresholds, restrictions on battery operation, multipath diversity, bandwidth requirements, transmission types (e.g., wired, wireless, etc.). The OF may provide rules defining the load balancing requirements, such as a number of selected parents (e.g., single parent trees or multi-parent DAGs). Notably, an example for how routing metrics and constraints may be obtained may be found in an IETF Internet Draft, entitled "Routing Metrics used for Path Calculation in Low Power and Lossy Networks"<draft-ietf-roll-routing-metrics-18> by Vasseur, et al. (Feb. 22, 2011 version). Further, an example OF (e.g., a default OF) may be found in an IETF Internet Draft, entitled "RPL Objective Function 0"<draft-ietf-roll-of0-05> by Thubert (Jan. 5, 2011 version).

Building a DAG may utilize a discovery mechanism to build a logical representation of the network, and route dissemination to establish state within the network so that routers know how to forward packets toward their ultimate destination. Note that a "router" refers to a device that can forward as well as generate traffic, while a "host" refers to a device that can generate but does not forward traffic. Also, a "leaf" may be used to generally describe a non-router that is connected to a DAG by one or more routers, but cannot itself forward traffic received on the DAG to another router on the DAG. Control messages may be transmitted among the devices within the network for discovery and route dissemination when building a DAG.

According to the illustrative RPL protocol, a DODAG Information Object (DIO) is a type of DAG discovery message that carries information that allows a node to discover a RPL Instance, learn its configuration parameters, select a DODAG parent set, and maintain the upward routing topology. In addition, a Destination Advertisement Object (DAO) is a type of DAG discovery reply message that conveys destination information upwards along the DODAG so that a DODAG root (and other intermediate nodes) can provision downward routes. A DAO message includes prefix information to identify destinations, a capability to record routes in support of source routing, and information to determine the freshness of a particular advertisement. Notably, "upward" or "up" paths are routes that lead in the direction from leaf nodes towards DAG roots, e.g., following the orientation of the edges within the DAG. Conversely, "downward" or "down" paths are routes that lead in the direction from DAG roots towards leaf nodes, e.g., generally going in the opposite direction to the upward messages within the DAG.

Generally, a DAG discovery request (e.g., DIO) message is transmitted from the root device(s) of the DAG downward toward the leaves, informing each successive receiving device how to reach the root device (that is, from where the request is received is generally the direction of the root). Accordingly, a DAG is created in the upward direction toward the root device. The DAG discovery reply (e.g., DAO) may then be returned from the leaves to the root device(s) (unless unnecessary, such as for UP flows only), informing each successive receiving device in the other direction how to reach the leaves for downward routes. This process helps build routing tables to send downward messages to any node in the DAG and not only to the leafs. Nodes that are capable of maintaining routing state may aggregate routes from DAO messages that they receive before transmitting a DAO message. Nodes that are not capable of maintaining routing state, however, may attach a next-hop parent address. The DAO message is then sent directly to the DODAG root that can in turn build the topology and locally compute downward routes to all nodes in the DODAG. Such nodes are then reachable using source routing techniques over regions of the DAG that are incapable of storing downward routing state.

Figure 3:
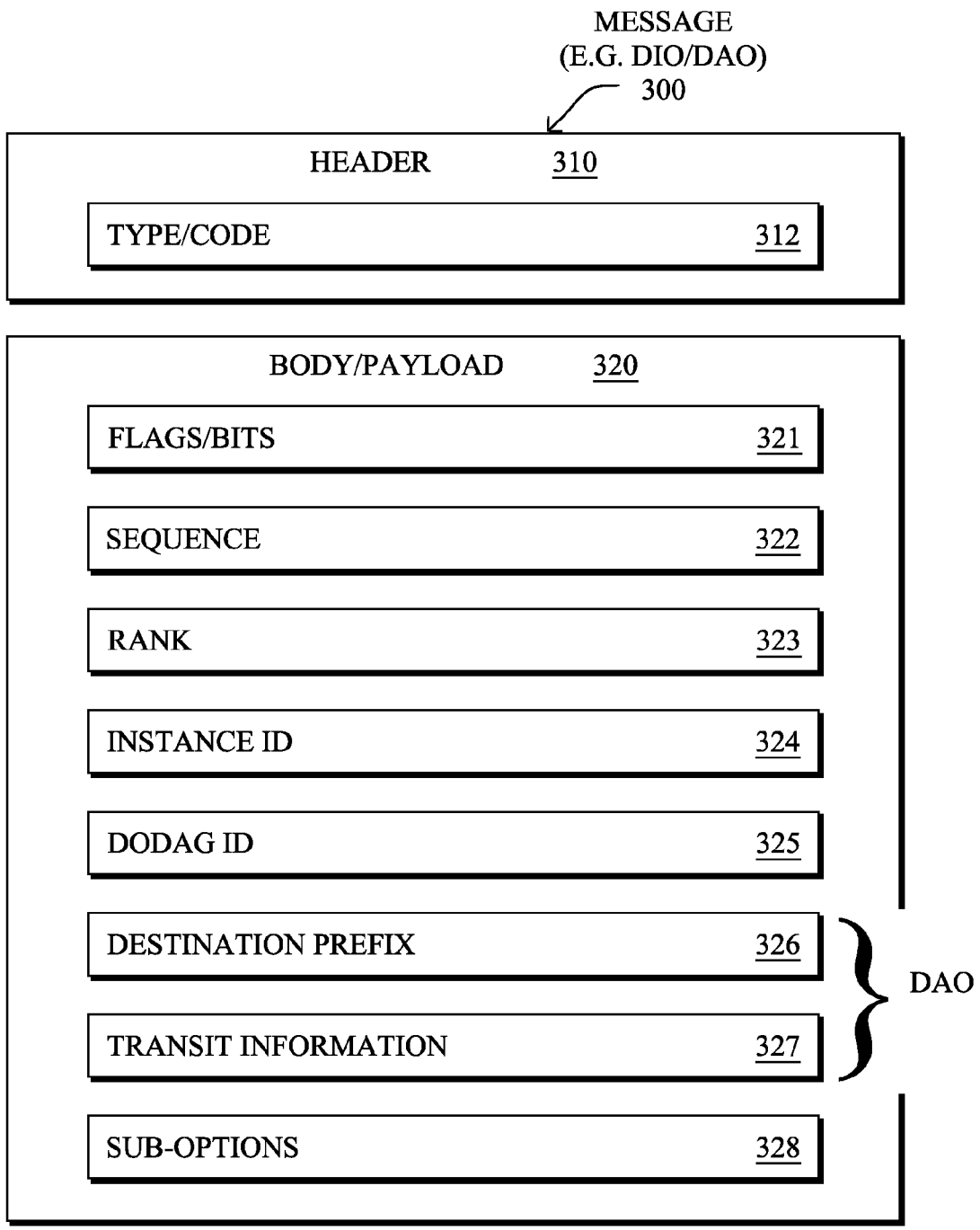
FIG. 3 illustrates an example message.

FIG. 3 illustrates an example simplified control message format 300 that may be used for discovery and route dissemination when building a DAG, e.g., as a DIO or DAO. Message 300 illustratively comprises a header 310 with one or more fields 312 that identify the type of message (e.g., a RPL control message), and a specific code indicating the specific type of message, e.g., a DIO or a DAO (or a DAG Information Solicitation). Within the body/payload 320 of the message may be a plurality of fields used to relay the pertinent information. In particular, the fields may comprise various flags/bits 321, a sequence number 322, a rank value 323, an instance ID 324, a DODAG ID 325, and other fields, each as may be appreciated in more detail by those skilled in the art. Further, for DAO messages, additional fields for destination prefixes 326 and a transit information field 327 may also be included, among others (e.g., DAO_Sequence used for ACKs, etc.). For either DIOs or DAOs, one or more additional sub-option fields 328 may be used to supply additional or custom information within the message 300. For instance, an objective code point (OCP) sub-option field may be used within a DIO to carry codes specifying a particular objective function (OF) to be used for building the associated DAG. Alternatively or in addition, sub-option fields may be used to carry other certain information within a message 300, such as indications, requests, capabilities, lists, etc., as may be described herein, e.g., in one or more type-length-value (TLV) fields. For instance, sub-option fields may be used to carry phase-based information as described below.

Phased-Based Operation of Devices

As noted above, electric power is generally transmitted from generation plants to end users (industries, commercial, residential, etc.) via a transmission grid consisting of a network of power stations, transmission circuits, and substations interconnected by power lines. Once at the end users, electricity can be used to power any number of devices, such as devices 200. The transmission and distribution of alternating-current (AC) electric power to the end users most frequently takes the form of polyphase electric power, a common form of which being three-phase electric power. For smaller customers (e.g., households) usually a single phase is taken to the property. For larger installations (large houses, buildings), all three phases may be taken to a distribution panel, from which both single and multi (two or three-phase) circuits may be fed.

Figure 4:
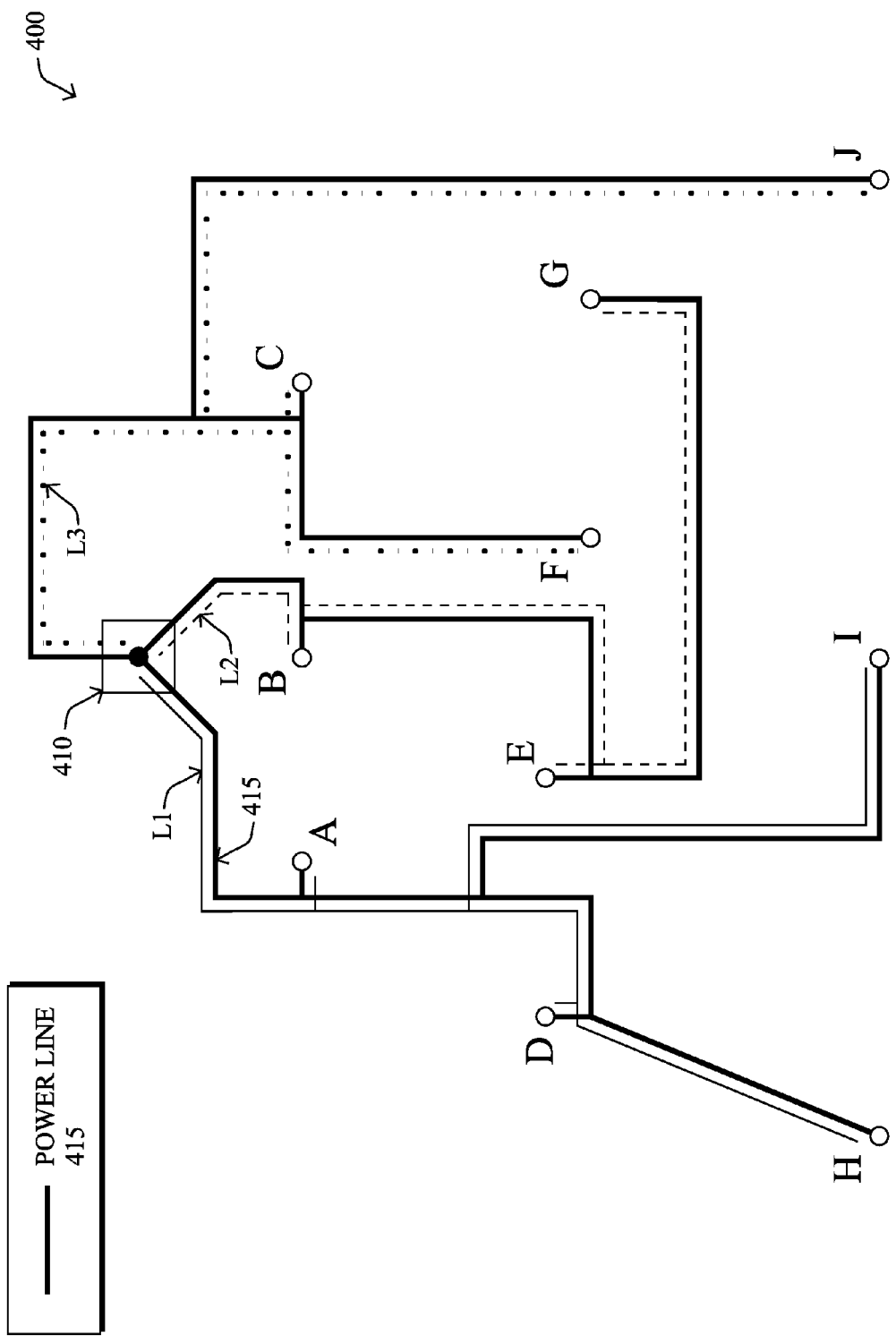
FIG. 4 illustrates an example polyphase electric distribution system.

FIG. 4 illustrates an example electric power transmission and distribution grid 400 to the example devices A-J of FIG. 1, above. (Note that although the terminology herein often refers to either "transmission" or "distribution," those skilled in the art will recognize that the embodiments herein may broadly cover both the transmission and distribution portion of the grid.) For instance, a distribution center 410 (e.g., generation plant, transformer station, etc.) supplies electricity over a plurality of transmission lines 415 to the devices 200. In the embodiments herein, the supplied electricity is part of a polyphase source system, where a plurality of phases (e.g., three) are transmitted onto the lines 415 to the devices, such that each device is generally attached to a particular phase of the electric grid. As shown, electrical power of three phases, L1, L2, and L3, is supplied to the devices A-J (a neutral/ground may be shared by the phases). Notably, the view shown herein is vastly simplified, as each phase may generally be used to power entire buildings, neighborhoods, etc, and may also supply power to many (e.g., tens, hundreds, thousands) of devices within those establishments. Also, while the view shown herein is generally arbitrarily connected, phase-based distribution grid topologies generally result in "clusters" of like-phased devices (e.g., those within the buildings, neighborhoods, etc.).

Figure 5B:
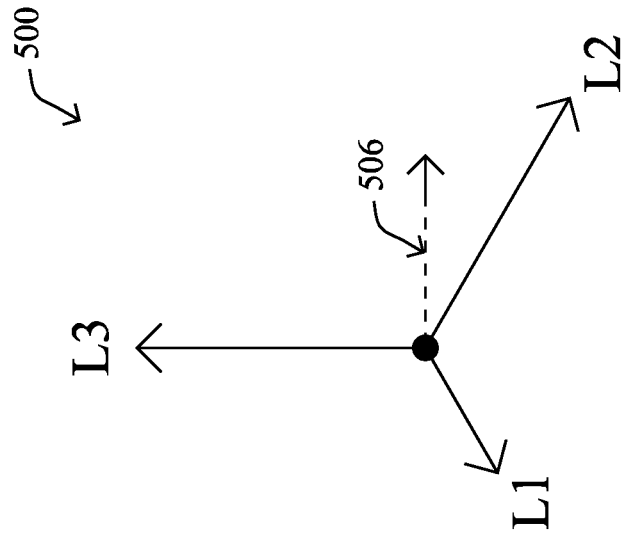
FIGS. 5A-B illustrate example phase representations of the polyphase electric distribution system.
Figure 5A:
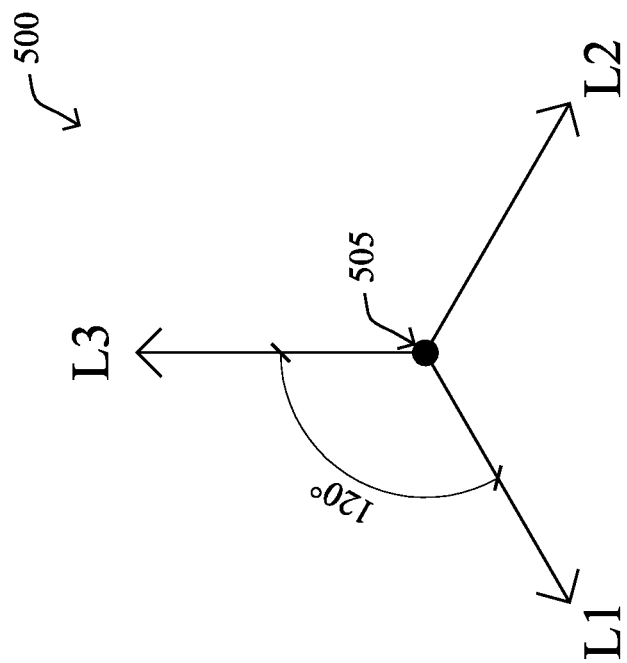

FIG. 5A illustrates an example phase representation 500 of the transmission (distribution) grid's electrical power. In particular, three current waveforms are illustratively produced (L1, L2, and L3) that are generally equal in magnitude and 120° out of phase to each other. The currents returning from the end users to the supply transformer all share the neutral wire (neutral point 505). If the loads are evenly distributed on all three phases, as they are in FIG. 5A, the sum of the returning currents in the neutral wire is approximately zero. Any unbalanced phase loading such as in FIG. 5B, however, may result in a current 506 at the neutral point, which may cause inefficient use of transformers, vibrations in generators, or other problems, including (but not limited to) brown-outs or black-outs in extreme cases. There are many factors that may create imbalance between the phases, such as excess load usage, downed power lines, etc.

The topology of the electric transmission grid typically considers the balancing of the three-phase system, such that each end user (and thus the end user's devices) is attached to the grid via a particular phase's current waveform. Most often, however, the end users, and more specifically the end users' devices, are unaware of which phase they are operating upon. In other words, the topology of the distribution grid is independent of the topology of the computer network. Accordingly, there is no phase-based control of the devices beyond planning the physical topology of the grid, which is difficult (and often expensive) to change once it is installed. For instance, if an imbalance is detected in the distribution system, there is no mechanism currently available to efficiently control devices plugged in to the grid in a phase-based manner.

The techniques herein therefore provide for phase-based control of networked is devices in a polyphase electric distribution grid. Specifically, according to one or more embodiments of the disclosure as described in greater detail below, a device in a computer network monitors an alternating-current (AC) waveform of an electrical power source at the device. Once the device determines a particular phase of the polyphase power source system (electric distribution grid) at the device based on the AC waveform, the device may then joins a directed acyclic graph (DAG) specific to the particular phase. Control messages (e.g., demand response or "DR" messages) may then be directed to devices on a particular DAG based on their associated phase.

Also, according to one or more additional embodiments of the disclosure as described in greater detail below, to determine the particular phase, the device may detect a time of a zero crossing of the AC waveform, and may then determine the particular phase of the polyphase power source system at the device based on the time of the zero crossing relative to a corresponding location within a frequency hopping superframe of the computer network. In one or more associated embodiments, the DR messages may be sent out to all devices along with an indication of the intended phase, such that each device knows its phase and thus knows whether to react to the DR messages.

Illustratively, the techniques described herein may be performed by hardware, software, and/or firmware, such as in accordance with phase detection process 247, which may contain computer executable instructions executed by the processor 220 to perform functions relating to the novel techniques described herein, e.g., in conjunction with DAG process 246 (creation of DAGs, joining to DAGs, etc.). For example, the techniques herein may be treated as extensions to conventional protocols, such as the RPL protocol, and as such, would be processed by similar components understood in the art that execute the RPL protocol, accordingly.

Operationally, by monitoring the AC waveform of the electrical power source at the device (e.g., from its power supply) phase detection process 247 can determine a particular phase of the device's power based on the AC waveform. While other techniques are possible, one illustrative novel technique that may be used to determine the phase is by detecting a time of a zero crossing of the AC waveform, and determining the particular phase based on the time of the zero crossing relative to a corresponding location within a frequency hopping superframe of the computer network.

Figure 6:
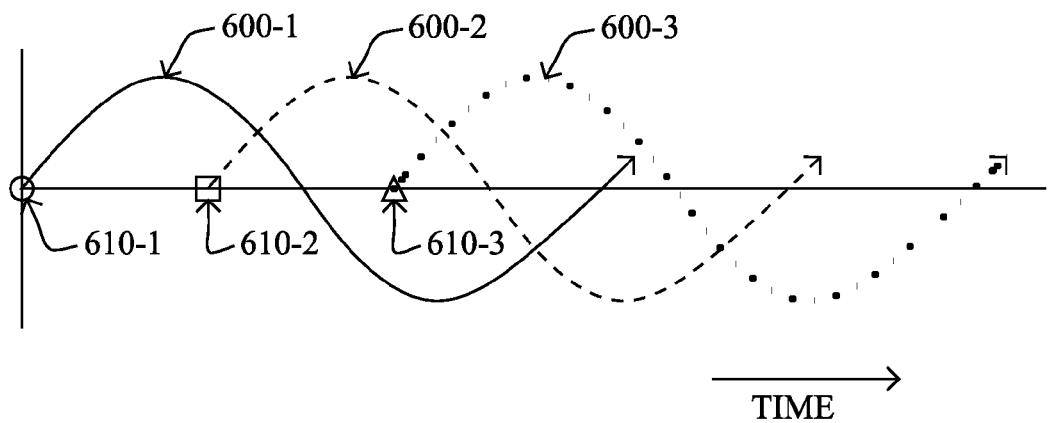
FIG. 6 illustrates an example alternating-current (AC) waveform for the polyphase electric distribution system.

For instance, as illustrated in FIG. 6, the usual form of an AC power circuit is a sine wave 600. In a three-phase system, three circuit conductors carry three alternating currents (of the same frequency), L1 (600-1), L2 (600-2), and L3 (600-3), which reach their instantaneous peak values at different times. For the sake of simplicity, the examples herein ignore the neutral wire which is used in many topologies. Taking one sine wave of conductor (L1) as the reference, the other two sine waves are delayed in time by one-third (L2) and two-thirds (L3) of one cycle of the electric current. Note that each single-phase waveform goes to zero at each moment that the voltage crosses zero. The illustrative technique determines these "zero crossings" 610, such as each time the wave crosses zero, or as shown, each time the wave increases through zero (or alternatively decreases through zero).

Each device (with a phase detection process 247) can determine the timing of its waveforms zero crossings, either 610-1, 610-2, or 610-3. With the determined zero crossing, the device then needs to correlate this time (these times) with a global reference clock. According to the illustrative technique, each node determines on which phase it sits by cross-referencing the zero crossing with a super-channel clock used for frequency hopping sequences.

Frequency hopping, also referred to as "frequency-hopping spread spectrum" (FHSS) is a method of transmitting radio signals by rapidly switching a carrier among numerous frequency channels, e.g., using a pseudorandom sequence known to both transmitter and receiver. For example, frequency hopping may be utilized as a multiple access method in the frequency-hopping code division multiple access (FH-CDMA) scheme. Generally, as may be appreciated by those skilled in the art, transmission using frequency hopping is different from a fixed-frequency transmission in that frequency-hopped transmissions are resistant to interference and are difficult to intercept. Accordingly, frequency-hopping transmission is a useful technique for many applications, such as sensor networks, LLNs, military applications, etc.

Figure 7:
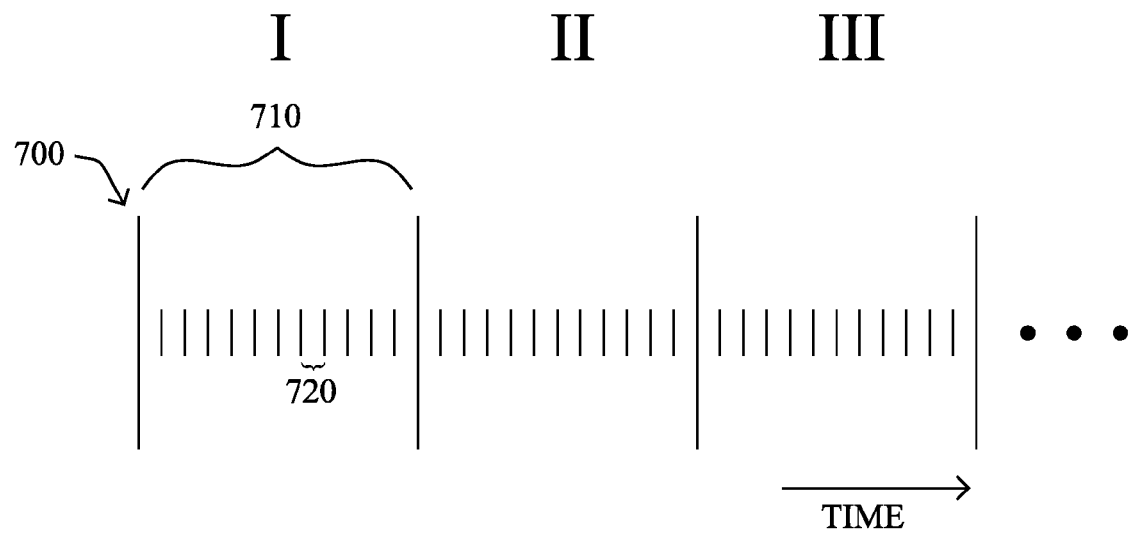
FIG. 7 illustrates an example frequency hopping sequence with superframes.

In particular, as shown in FIG. 7, in frequency hopping networks, time frames ("superframes") are divided within a frequency hopping sequence 700 into regular timeslots 710 (I, II, III, etc.), each one operating on a different frequency. A reference clock may be provided for the time frames for an entire network (e.g., mesh/cell), and a media access control (MAC) layer of each node divides time into timeslots that are aligned with the timeslot boundary of its neighbor (e.g., parent node). Also, each timeslot 710 may be further divided into sub-timeslots 720, e.g., 6, 8, or 12 sub-timeslots within a timeslot. Illustratively, the MAC layer is in charge of scheduling the timeslot in which a packet is sent, the main objective of which being randomization of the transmission time in order to avoid collisions with neighbors' packets.

According to this illustrative phase determination technique, each device may receive information about the zero crossing timing of each phase with relation to the frequency hopping superframe 700. For instance, such "interpretation" information may be relayed via DIO message 300 down to the nodes of the network, such that each node/device may use this information to determine how to proceed. In accordance with a particular embodiment, for example, a DAG root may be used as a reference node against which all other nodes in the DAG calibrate their phase measurement. That is, the only thing visible to a specific node in certain embodiments is when its own power sine wave crosses zero. In order to bring this into perspective, the nodes may need reference zero crossing information from a DAG root or else report their zero crossing to the root for computation, each as described below.

Figure 8A:
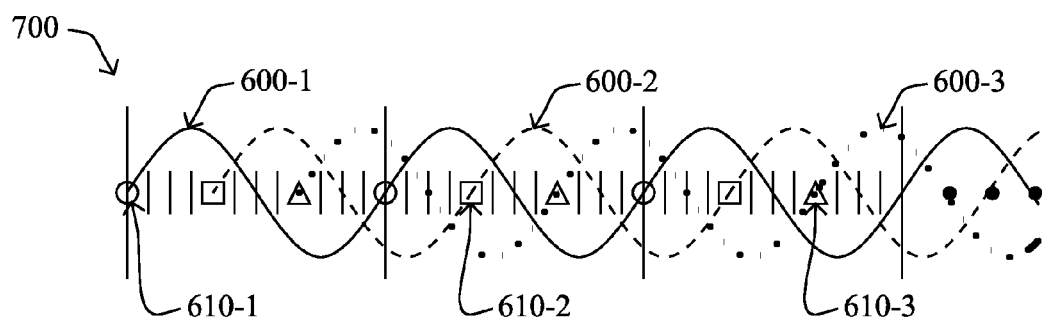
FIGS. 8A-B illustrate example zero crossings of the AC waveform with relation to the frequency hopping superframes.

FIG. 8A illustrates an example correlation between zero crossings 610 and the frequency hopping superframe 700. For instance, by overlaying the waveforms 600 onto the superframe 700, it can be seen how the zero crossings 610 correspond to a particular location (e.g., a particular sub-frame 720) within the superframe. Having the interpretation information above, each device can determine whether it is attached to phase L1, L2, or L3 based on when its zero crossings occur in relation to the timing of the frequency hopping superframe. Note that the zero crossings through the frequency hopping frame occur at certain points based on the phase, but that these points could happen anywhere (in a manner known for the interpretation information). The view shown herein is merely for illustration.

It is recognized that reactive loads and capacitor banks may affect the specific is angle between the three phases. Therefore, as the load changes with time, the specific relative zero crossing may change with time as well. In accordance with a specific embodiment each node monitors and reports the timing of its zero crossing to the DAG root. The DAG root averages the reported timing from each node and keeps track of the phase to which the node is connected. It should be also noted that the phase (zero crossings) variations are usually smaller than the nominal 120 degrees between the various phases. One aspect of the above-mentioned system is to detect (and record) when, e.g., due to maintenance or grid restoration, a node is switched from one phase to another phase.

Figure 8B:
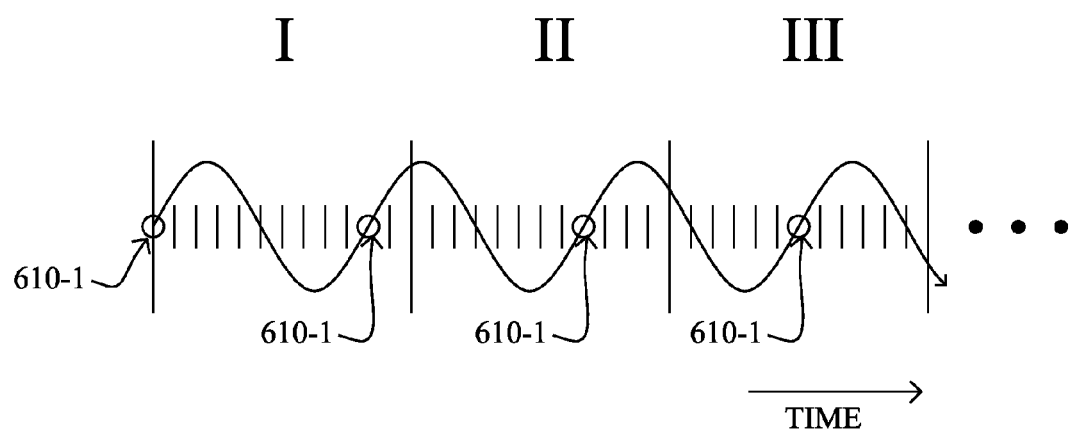

Further, FIG. 8B illustrates how these zero crossings may not be the same between frames 710, since the period of the waveform may not directly coincide with the period of the frames within the superframe. Accordingly, the interpretation information may include a number of zero crossing timings throughout the superframe for each particular phase's waveform. Alternatively or in addition, since the period of the waveforms 600 is regular (i.e., consistent, such as 60 Hz), in one embodiment the interpretation is merely the first zero crossing of each waveform, or even more simplistically, of a particular waveform (since the remaining waveforms are equidistant, e.g., at one-third and two-thirds of the first waveform's period for a three-phase system).

Note, again, that using the frequency hopping superframe is merely one example technique to determine the phase. Other techniques may be used herein, such as those using zero crossings (e.g., correlated with a general network clock), or otherwise (e.g., using signals or pulses transmitted and detected on each individual phase's transmission lines).

Figure 9:
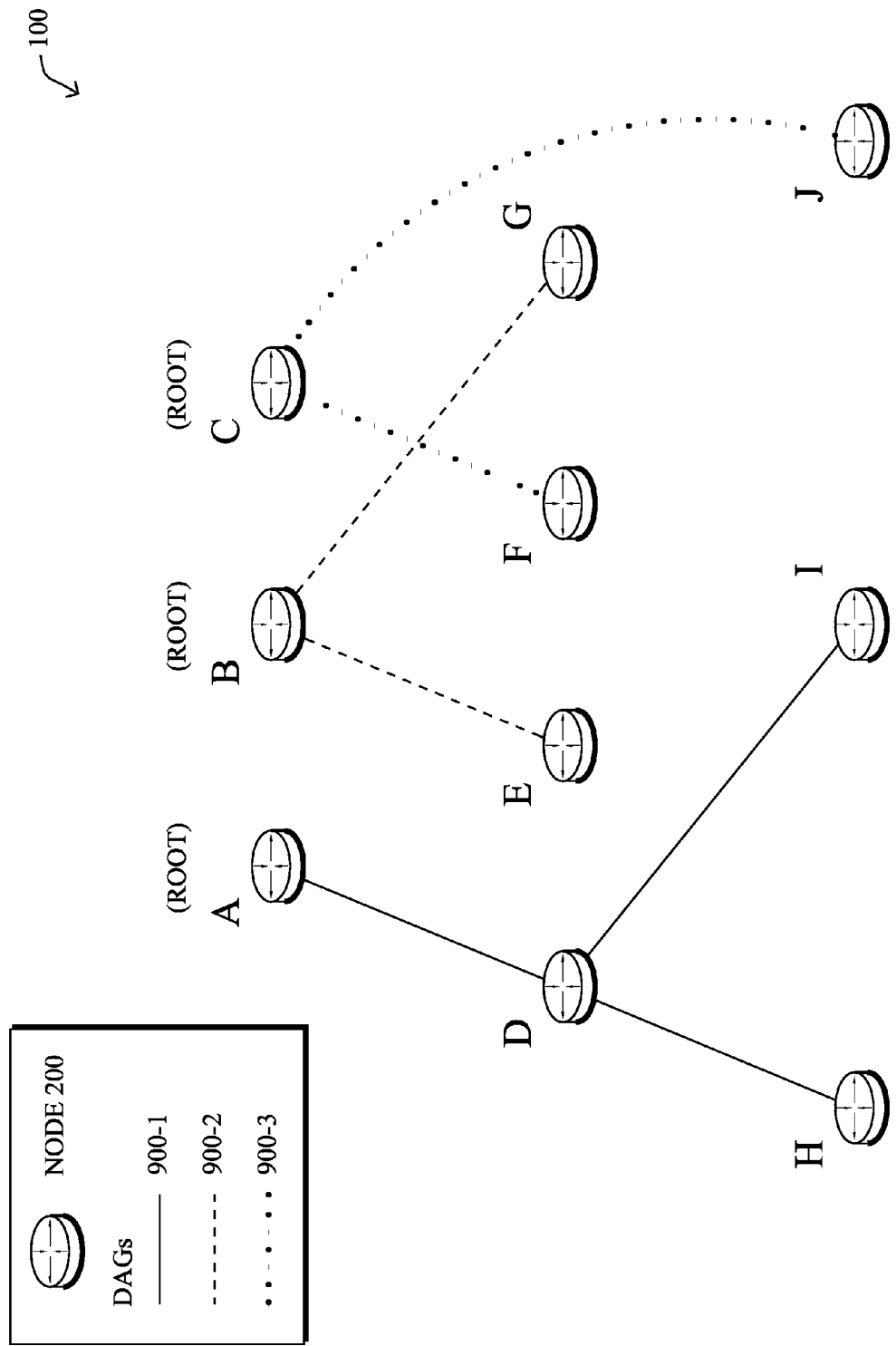
FIG. 9 illustrates example phase-based directed acyclic graphs (DAGs) in the computer network of FIG. 1.

According to one or more embodiments herein, once a device knows its phase relation, the device can join a directed acyclic graph (DAG) specific to the particular phase. FIG. 9 illustrates example DAGs that may be created, e.g., through the techniques described above, within network 100 of FIG. 1, such that, in essence, a special DAG is created for each set of nodes (e.g., meters) associated with one of the phases. For instance, for a three-phase system, three corresponding DAGs may be created (or more, such as for general maintenance and operation). Certain links may be selected for each node to communicate with a particular parent (and thus, in the reverse, to communicate with a child, if one exists) based on the phase of each node. That is, when a choosing a potential parent node, a child node considers the parent node's associated phase as a DAG parameter (communicated to the child node via messages 300, accordingly). These selected links form the DAGs 900, which each extend from a root node toward one or more leaf nodes (nodes without children). Traffic/packets 140 (shown in FIG. 1) may then traverse each of the DAGs 900 independently in either the upward direction toward the root or downward toward the leaf nodes.

In particular, in one or more embodiments, the specific phase detection may occur in concert with information from an original DAG root. For example, the process can start with all nodes in the network 100 communicating with a single master root, e.g., node A in the topology shown in FIG. 1 above. This initial root may select a specific phase to be the reference phase (e.g., 600-1, L1's waveform) and informs the nodes in its DAG (routing domain/cell) regarding the offset of the zero crossing 610-1 it sees for the reference sine wave and the super frame 700. The other two root nodes (e.g., node B and node C) may each select one of the other phases and declare (advertise) that they will service it. Nodes may then begin to migrate to the new DAGs (900-2 and 900-3), while certain nodes remain in the original DAG (now 900-1) as their phase matches the phase of the original root, node A.

As noted above, the DAGs 900-1, 900-2, and 900-3 may be configured as MTR instances on the devices, such that a general, all-encompassing DAG may be used to ensure connectivity to all of the devices in the network. Also, as an additional feature on top of the phase-specific DAGs, or as an alternative to phase-specific DAGs altogether, multicast groups may be established for each phase, such that devices may join a corresponding multicast group specific to its phase. Similarly, a virtual local area network (VLAN) may be configured for each phase, e.g., on each DAG, as may be appreciated by those skilled on the art.

Now that each device is aware of its power source's phase, control messages may be transmitted in the network based on the phase, accordingly. For instance, nodes may now provide phase-specific reporting to a data collection device (e.g., the root nodes). Also, a management device (e.g., within distribution center 410 or otherwise) may issue "demand response" or "DR" messages to the nodes/devices of the network based on their phases. For example, as noted above in FIG. 5B, imbalance may occur in the polyphase system, such as from overloaded phases, etc., which can cause various concerns/issues.

Figure 10:
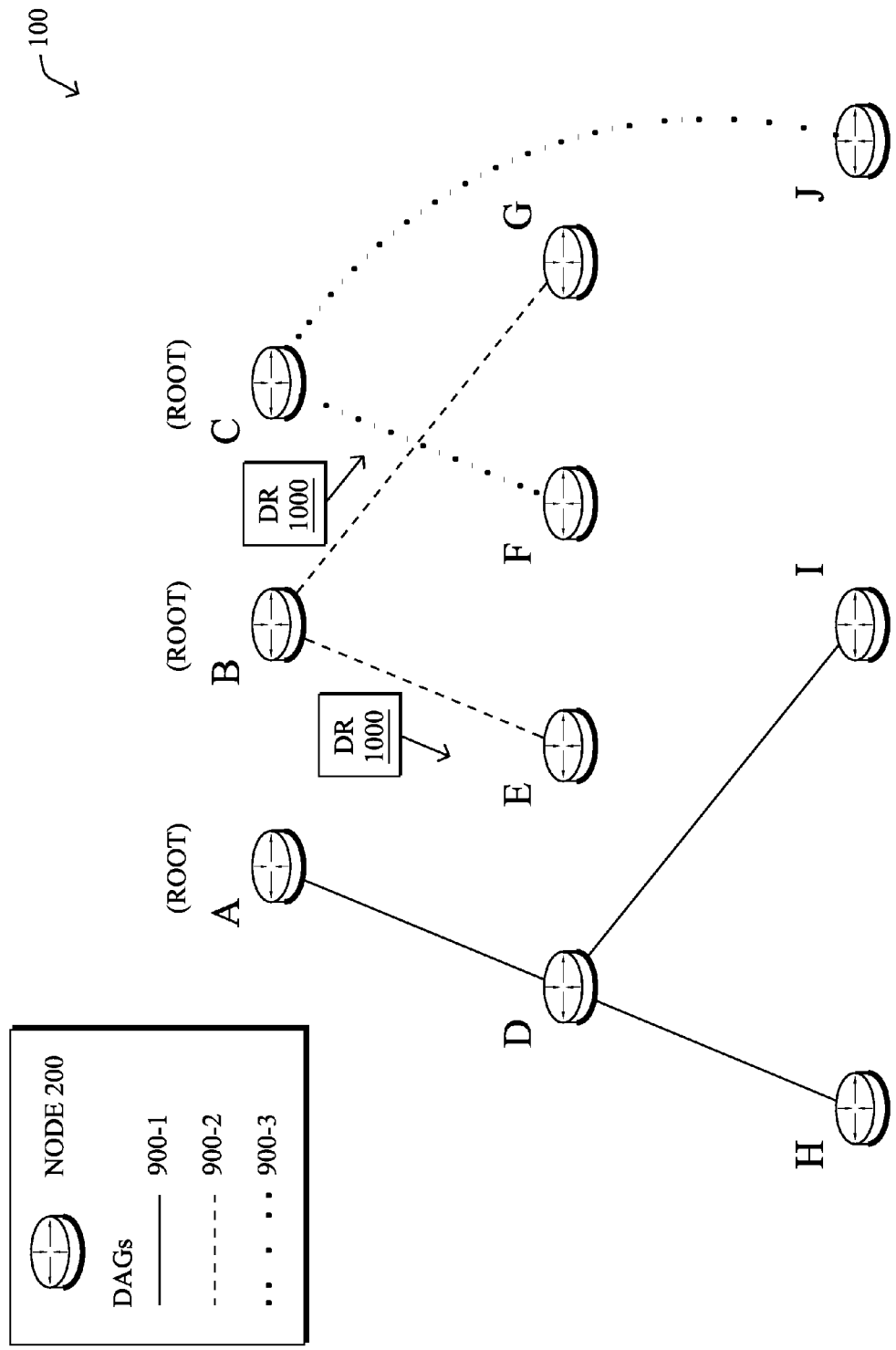
FIG. 10 illustrates an example demand response (DR) message on a DAG.

As such, as shown in FIG. 10, a DR message 1000 may be issued on a particular DAG (e.g., 900-2), and any node on that DAG (nodes B, E, and G) may invoke its DR process 248 to take the required action of the DR message. For instance, if too much power is being drawn from a particular phase (e.g., from a substation), the DR message 1000 may request that any non-necessary systems conserve energy (shut down, reduce consumption, delay operation, etc.) until the problem has been resolved (e.g., until a second DR message 1000 clearing the condition, or else after a set time period indicated in the first DR message). Accordingly, devices may receive a phase-specific DR message on the DAG specific to their particular phase, and may react/respond to the DR message as requested (if able to do so). Alternatively, such as where no phase-specific DAGs are created, the DR message 1000 may be phase-specific but sent to all devices on a general DAG, such that all devices receive the message and determine whether to react based on the indicated specific phase.

Note that the techniques herein allow for the dynamic monitoring of the zero crossing timing with regard to the superframe, which therefore allows for detection of phase changes at the devices. For instance, a device may detect that it was moved to another phase based on the AC waveform, and may then automatically invoke a DAG migration (RPL tree migration) to the DAG specific to the new phase. Note that a node may have policies that dictate when to change DAGs since DAG migration can be expensive in terms of control plane messages, authentication, requirements, etc.

Figure 11:
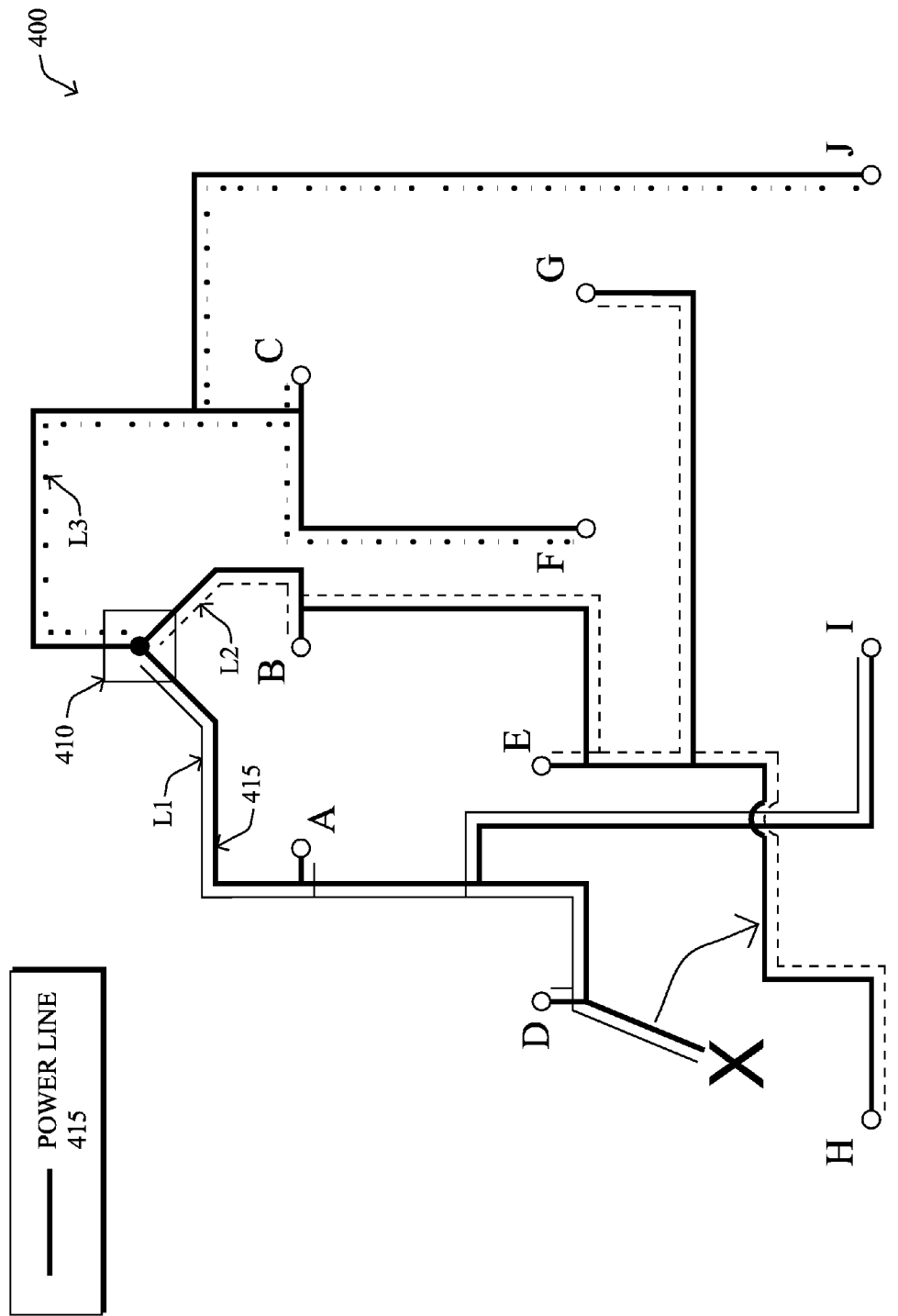
FIG. 11 illustrates a change in the example polyphase electric distribution system of FIG. 4.
Figure 12:
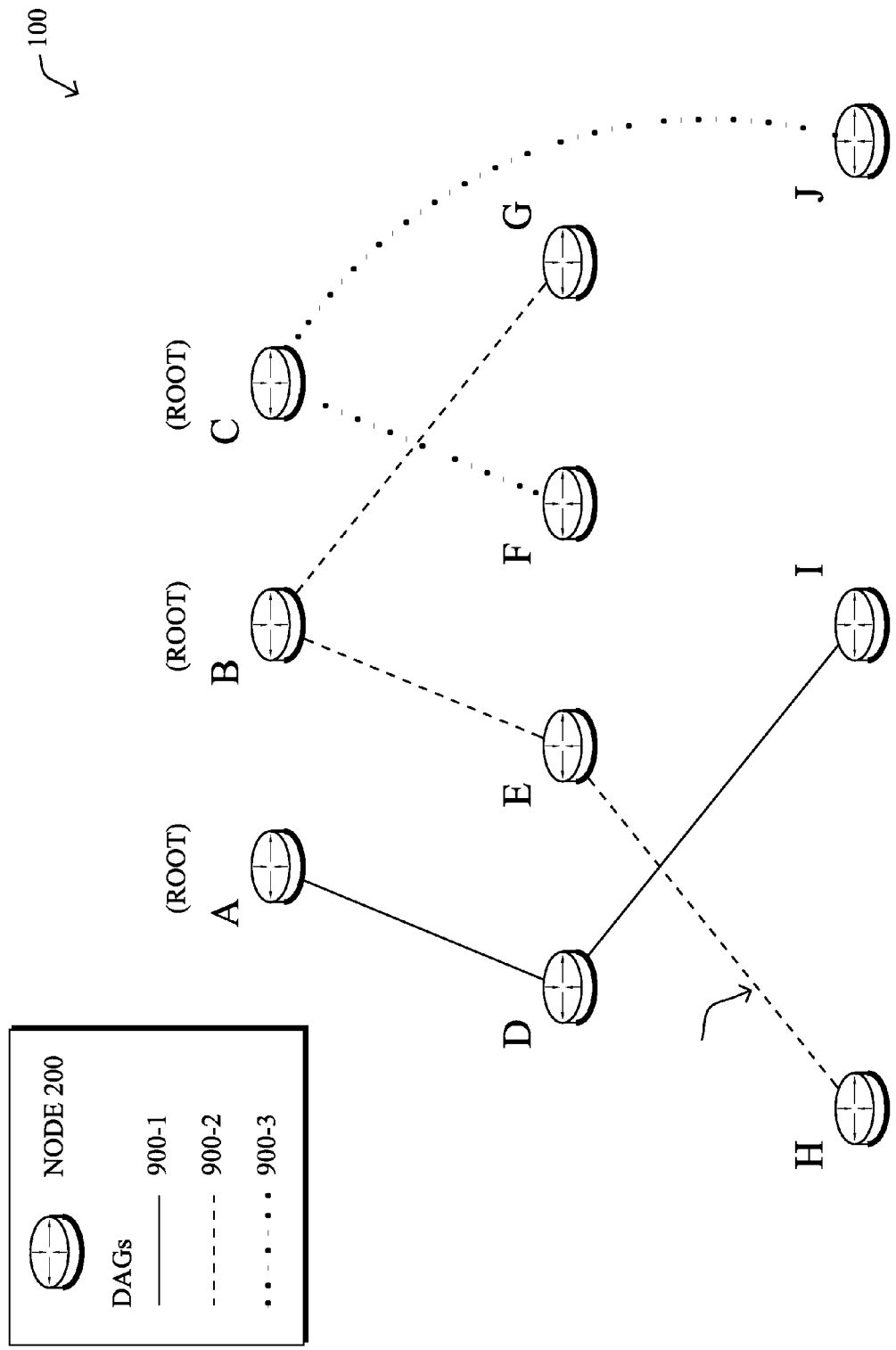
FIG. 12 illustrates a corresponding change in the example phase-based DAGs in the computer network of FIG. 9.

FIG. 11 illustrates an example physical change (e.g., a downed power line) in the grid that could result in a device being moved to another phase as part of the restoration process. Accordingly, based on the techniques described above, node H may correspondingly change DAGs to 900-2 as shown in FIG. 12 to join the DAG specific to its new phase, L2.

Figure 13:
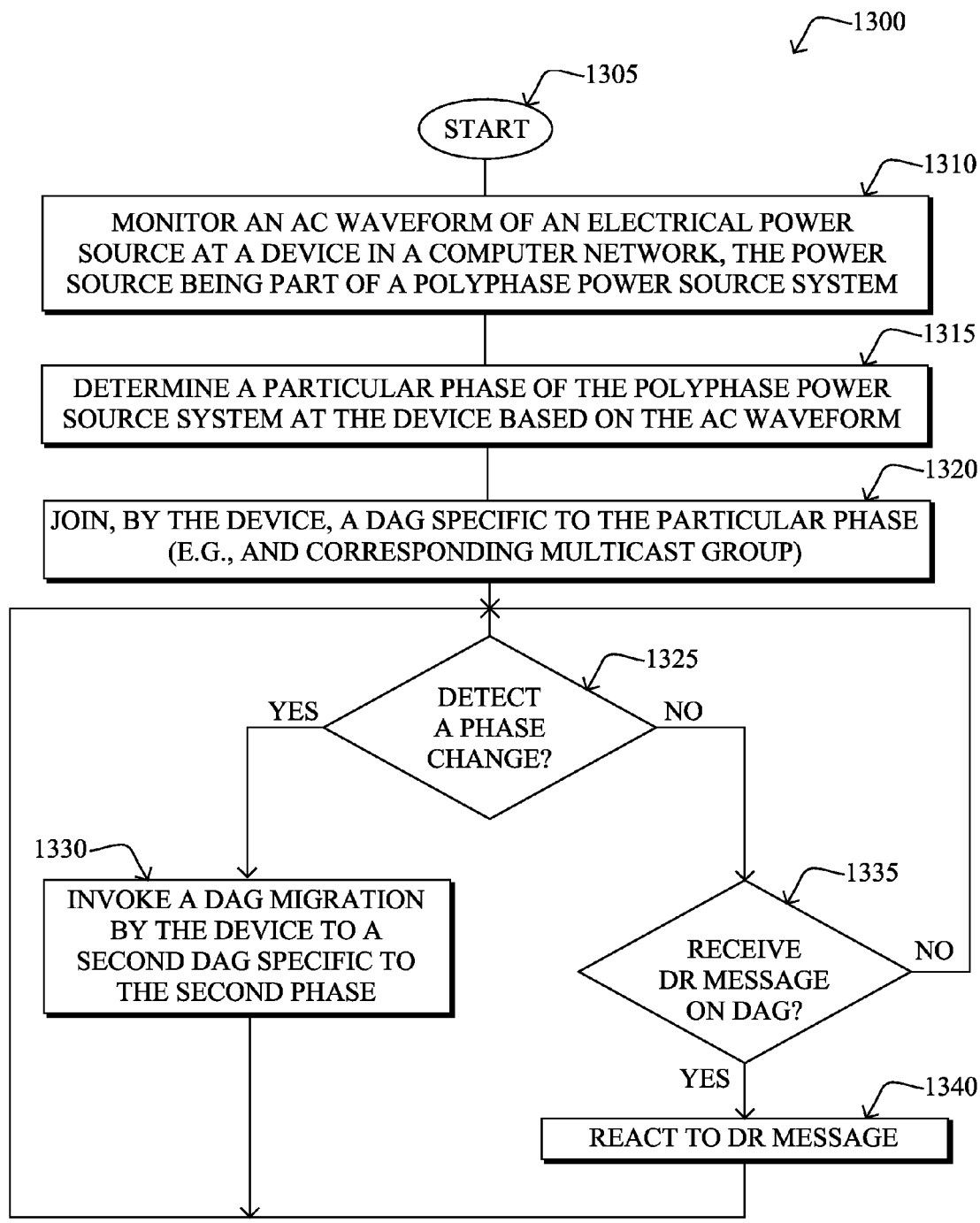
FIG. 13 illustrates an example simplified procedure for creating phase-based DAGs.

FIG. 13 illustrates an example simplified procedure for creating phase-based DAGs 900 in accordance with one or more embodiments described herein, from the perspective of each device 200 (e.g., joining a DAG). The procedure 1300 starts at step 1305, and continues to step 1310, where a device, e.g., node H, monitor an AC waveform 600 of an electrical power source, which is part of a polyphase power source system. In step 1315, the system determines a particular phase (e.g., L1) of the polyphase power source system based on the AC waveform, e.g., according to its relation to frequency hopping superframes and with respect to the reference provided by the DAG root as described by the illustrative embodiment herein and also with reference to FIG. 14 below.

Once the device's particular phase is determined, then in step 1320 the device may join a DAG specific to the particular phase, e.g., DAG 900-1 for phase L1. Note also that as described above, the device may also join a corresponding multicast group on the DAG. If there is a phase change detected in step 1325 (such as by monitoring and determining in step 1310 and 1315), then in step 1330 the device may invoke a DAG migration to thus join a second DAG specific to the newly determined phase. Also, if a DR message 1000 is received on the DAG in step 1335, then in step 1340 the device may react to the DR message as described above. In case no DR command is received in step 1335, the procedure returns to step 1325 where it checks whether a topology change of the grid occurred which may have resulted in changing the phase from which the specific node receives its power.

It should be noted that while certain steps within procedure 1300 may be optional as described above, the steps in FIG. 13 are merely an example for illustration, and certain steps may be included or excluded as desired.

Figure 14:
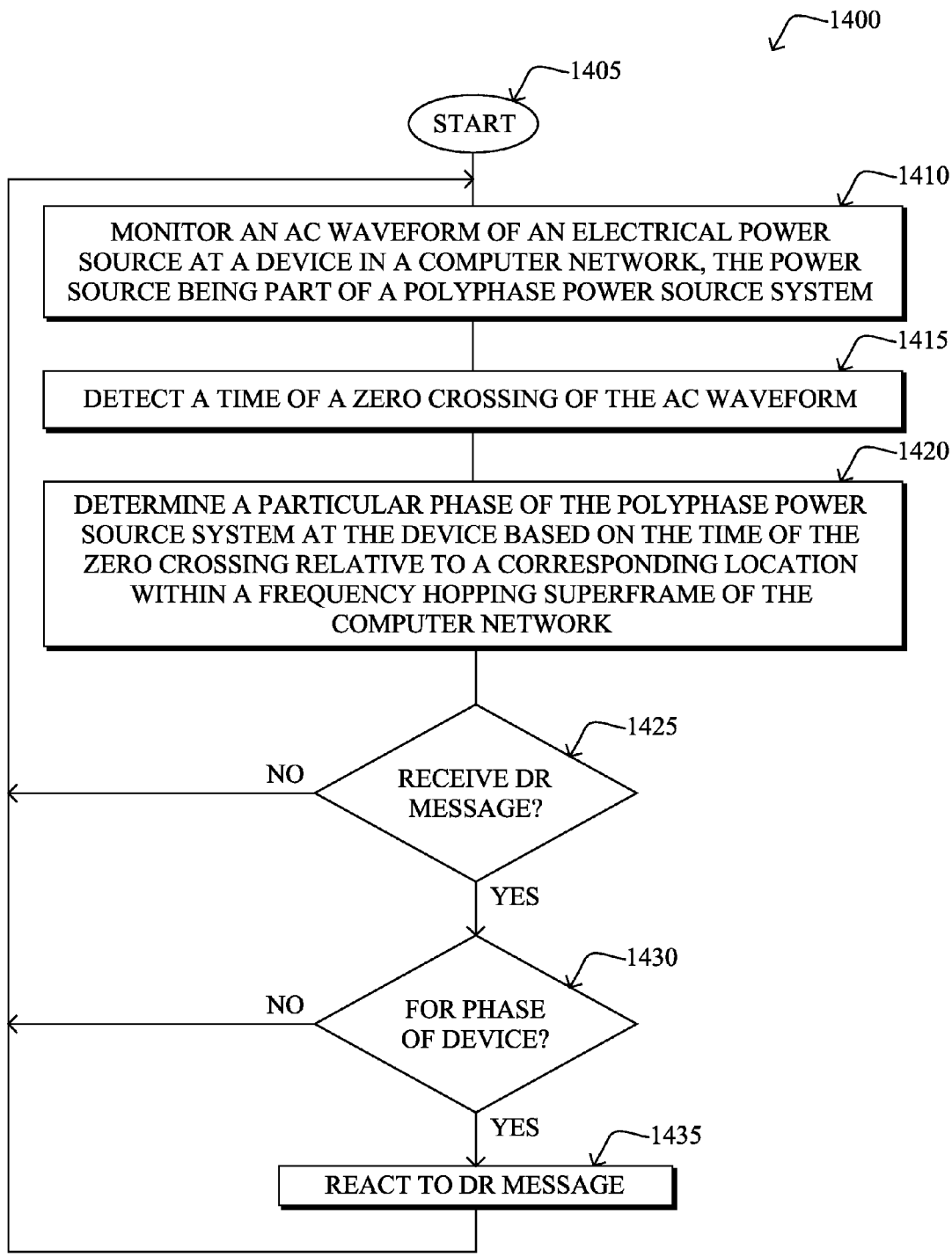
FIG. 14 illustrates an example simplified procedure for determining a particular phase of a device in a polyphase system based on its relation to frequency hopping.

FIG. 14 illustrates an example simplified procedure for determining a particular phase of a device in a polyphase system based on its relation to frequency hopping in accordance with one or more embodiments described herein. The procedure 1400 starts at step 1405, and continues to step 1410, where the device, e.g., node H, monitors an AC waveform 600-1 of an electrical power source of a polyphase power source system. In step 1415, the device/system detects a time of a zero crossing 610-1 of the AC waveform, and correlates it with frequency hopping in step 1420 to determine a particular phase of the polyphase power source system at the device based on the time of the zero crossing relative to a corresponding location within a frequency hopping superframe 710, as described in greater detail above. Note that at this point, the device may or may not join a corresponding DAG as mentioned above.

In the event a DR message 1000 is received at the device in step 1425, then assuming no DAG is joined, in step 1530 the device may determine whether the DR message was intended for its particular phase (or a group of phases or all phases). If so, then in step 1435 the device may react to the DR message, accordingly. The procedure 1400 returns to step 1410 to continue to monitor the waveform in order to detect any changes to the device's phase.

It should also be noted that while certain steps within procedure 1400 may be optional as described above, the steps in FIG. 14 are merely an example for illustration, and certain steps may be included or excluded as desired. Further, while procedures 1300 and 1400 are described separately, certain steps from each procedure may be incorporated into each other procedure, and the two procedures are not meant to be mutually exclusive.

The novel techniques described herein, therefore, provide for phase-based operation/control of devices in a computer network that are powered by a polyphase electric system. In particular, the novel techniques create DAGs dynamically based on which phase is powering a particular device, which in one or more illustrative embodiments is based on the timing of the phase with relation to frequency hopping superframes. Accordingly, control of the devices in the computer network may be phase-based, such that messages may be delivered to (and received from) specific devices in the network based on their respective phases, such as DR messages or other types of management messages. That is, by segmenting the DAG according to the specific phase from which the devices draw energy, phase-targeted messages (such as a DR) can traverse the LLNs without affecting traffic to/from devices connected to other phases. Further, the adaptive (dynamic) techniques above provide functionality that would be difficult, if not practically impossible, to perform manually, particularly for networks with a large number of nodes.

While there have been shown and described illustrative embodiments that provide for phase-based operation/control of devices in a computer network that are powered by a polyphase electric system, it is to be understood that various other adaptations and modifications may be made within the spirit and scope of the embodiments herein. For example, the embodiments have been shown and described herein with relation to LLNs, and more particular, to the RPL protocol. However, the embodiments in their broader sense are not as limited, and may, in fact, be used with other types of networks and/or protocols utilizing DAG routing (e.g., distance vector protocols). Also, while the embodiments above generally describe the polyphase source system as a three-phase system, this is merely one example embodiment of a polyphase system (granted, the most prevalent type today), and is not meant to limit the embodiments herein. In addition, as noted above, while the techniques above may be made reference to transmission systems or distribution systems, however the disclosure herein applies to both the transmission and distribution portions of the electric grid.

Further, while certain embodiments above described joining a particular DAG based on phase, or changing to a new DAG based on phase changes, there may be instances where a phase-based DAG decision is unavailable. For instance, if a device is powered by a particular phase, but there are no parent nodes available in a DAG of that phase, then the device may be forced to join a DAG of a different phase. In this case, the device may configure itself to ignore certain control messages (e.g., DR messages), and/or may notify its DAG root of the mismatched phase for further processing and/or reporting. Typically, however, since phase-based electric power distribution generally creates regions of like-phased devices (e.g., a building, a neighborhood, etc.), the likelihood of a device being separated from a DAG of its phase is limited. One instance where phase-based decisions may not be available (or necessary), is where battery-operated devices share the computer network 100 with grid-powered (plug-in) devices, in which case the batter-operated devices may join whichever DAG is more convenient.

Moreover, while the techniques above describe a distributed phase-based determination, where each device determines its own phase, it is possible in one or more embodiments herein to provide a centralized computation, where devices learn of their phases from an external source. For instance, each device in the network may send information to a central computation device (e.g., a DAG root on a generic all-encompassing DAG), such as information regarding its detected zero crossings, and then the root device may respond to the device with the device's associated phase. Also, those skilled in the art should recognize that the zero crossing technique used for identifying the phase to which a device is connected is merely one illustrative embodiment. The embodiments herein may also alternatively (or in addition) use systems which incorporate other phase detection methods, such as external devices (e.g., "phasors" which operate in sync with the GPS clocks).

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:
monitoring an alternating-current (AC) waveform of an electrical power source at a device in a frequency-hopping computer network, the power source being part of a polyphase power source system;
detecting a time of a zero crossing of the AC waveform; and
determining a particular phase of the polyphase power source system at the device based on the time of the zero crossing relative to a corresponding location within a frequency hopping superframe of the computer network.

2. The method as in claim 1, further comprising:
joining, by the device, a directed acyclic graph (DAG) specific to the particular phase.

3. The method as in claim 1, further comprising:
receiving a demand response (DR) message specific to the particular phase; and
reacting to the DR message.

4. The method as in claim 1, further comprising:
detecting a phase change at the device based on the AC waveform to a second phase.

5. An apparatus, comprising:
a power supply adapted to receive an alternating-current (AC) waveform of an electrical power source, the power source being part of a polyphase power source system;
a network interface adapted to communicate in a frequency hopping computer network;
a processor coupled to the network interface and adapted to execute one or more processes; and
a memory configured to store a process executable by the processor, the process when executed operable to:
monitor the AC waveform;
detect a time of a zero crossing of the AC waveform; and
determine a particular phase of the polyphase power source system at the power supply based on the time of the zero crossing relative to a corresponding location within a frequency hopping superframe of the computer network.

6. The apparatus as in claim 5, wherein the process when executed to is further operable to:
join a directed acyclic graph (DAG) specific to the particular phase via the network interface.

7. The apparatus as in claim 5, wherein the process when executed to is further operable to:
receive a demand response (DR) message specific to the particular phase; and
react to the DR message.

8. The apparatus as in claim 5, wherein the process when executed to is further operable to:
detect a phase change at the power supply based on the AC waveform to a second phase.

9. A tangible, non-transitory, computer-readable media having software encoded thereon, the software when executed by a processor on a device in a frequency hopping computer network operable to:
monitor an alternating-current (AC) waveform of an electrical power source at a device in a computer network, the power source being part of a polyphase power source system;
detect a time of a zero crossing of the AC waveform; and
determine a particular phase of the polyphase power source system at the device based on the time of the zero crossing relative to a corresponding location within a frequency hopping superframe of the computer network.

10. The computer-readable media as in claim 9, wherein the software when executed is further operable to:
join the device to a directed acyclic graph (DAG) specific to the particular phase.

11. The computer-readable media as in claim 9, wherein the software when executed is further operable to:
receive a demand response (DR) message specific to the particular phase; and
react to the DR message.

12. The computer-readable media as in claim 9, wherein the software when executed is further operable to:
detect a phase change at the device based on the AC waveform to a second phase.

* * * * *